(12) United States Patent
Gupta et al.

(10) Patent No.: US 11,645,503 B2
(45) Date of Patent: May 9, 2023

(54) MULTIBIT NEURAL NETWORK

(71) Applicants: IMEC VZW, Leuven (BE); Katholieke Universiteit Leuven, KU LEUVEN R&D, Leuven (BE)

(72) Inventors: Mohit Gupta, Heverlee (BE); Bharani Chakravarthy Chava, Leuven (BE); Wim Dehaene, Kessel-Lo (BE); Sushil Sakhare, Heverlee (BE)

(73) Assignees: Imec vzw, Leuven (BE); Katholieke Universiteit Leuven, Leuven (BE)

( * ) Notice: Subject to any disclaimer, the term of this patent is extended or adjusted under 35 U.S.C. 154(b) by 739 days.

(21) Appl. No.: 16/723,131

(22) Filed: Dec. 20, 2019

(65) Prior Publication Data

US 2020/0210822 A1    Jul. 2, 2020

(30) Foreign Application Priority Data

Dec. 28, 2018 (EP) .................................... 18248192

(51) Int. Cl.
*G06N 3/063* (2023.01)
*G06F 7/544* (2006.01)
(Continued)

(52) U.S. Cl.
CPC ........... *G06N 3/063* (2013.01); *G06F 7/5443* (2013.01); *G06N 3/04* (2013.01); *G11C 11/54* (2013.01)

(58) Field of Classification Search
CPC ........ G06N 3/063; G06N 3/04; G06N 3/0635; G06F 7/5443; G11C 11/54; G06G 7/16
See application file for complete search history.

(56) References Cited

U.S. PATENT DOCUMENTS

| 5,343,555 A | 8/1994 | Yayla et al. |
| 5,617,053 A | 4/1997 | Shou et al. |

(Continued)

FOREIGN PATENT DOCUMENTS

| EP | 3370145 A1 * | 9/2018 | ............ G06F 7/523 |
| EP | 3370145 A1 | 9/2018 | |
| WO | 2004095463 A1 | 11/2004 | |

OTHER PUBLICATIONS

European Search Report, European Patent Application No. 18248192. 9, dated Jul. 8, 2019, 9 pages.

*Primary Examiner* — Ajay Ojha
(74) *Attorney, Agent, or Firm* — McDonnell Boehnen Hulbert & Berghoff LLP

(57) ABSTRACT

A circuit is provided. The circuit includes a sampling circuit connectable to a multibit memory array and that samples a voltage across a sampling capacitor, a capacitance network including a plurality of capacitors and switching elements such that the capacitance network has a capacitance that depends on the configuration of the switching elements, and a buffering circuit configured to charge the capacitance of the capacitance network based on the voltage across the sampling capacitor. The circuit is configured to operate the capacitance network in a first state and a second state, wherein the capacitance in the states depends on an input value to the circuit. The circuit is also configured to charge the capacitance network in the first state and to allow the charge to redistribute within the capacitance network when it changes from the first to the second state. A system and method including such circuits are also provided.

20 Claims, 4 Drawing Sheets

(51) Int. Cl.
*G06N 3/04* (2023.01)
*G11C 11/54* (2006.01)

(56) References Cited

U.S. PATENT DOCUMENTS

| | | |
|---|---|---|
| 9,697,877 B2 | 7/2017 | Shanbhag et al. |
| 2019/0392298 A1* | 12/2019 | Oshima ................. G06F 7/5443 |
| 2020/0133990 A1* | 4/2020 | Mathuriya ........... G06N 3/0635 |

* cited by examiner

MULTIBIT NEURAL NETWORK

CROSS-REFERENCE TO RELATED APPLICATIONS

The present application is a non-provisional patent application claiming priority to European Patent Application No. EP 18248192.9, filed Dec. 28, 2018, the contents of which are hereby incorporated by reference.

FIELD OF THE DISCLOSURE

The present disclosure relates to the field of circuits for artificial neural networks. In particular, the present disclosure relates to a circuit for a multibit artificial neural network.

BACKGROUND

When constructing artificial neural networks (ANNs), high memory requirements and large space consumption may pose a design challenge. Binary ANNs may reduce the memory requirements, but as the precision of the ANN is reduced the accuracy goes down as well. Although switching from standard memory arrays to multibit equivalents may provide an increased memory density while still retaining a sufficient accuracy, reading from such multibit memory may be challenging and may use at least one analog-to-digital converter (ADC) per memory column. Such ADCs may consume substantial amounts of energy as well as area, and the benefits of using multibit memory may therefore be cancelled out.

Based on the above, there is therefore a need for an improved way of reading from a multibit ANN.

SUMMARY

To at least partially fulfill the above need, the present disclosure seeks to provide a circuit for an artificial neural network and a system as defined in the independent claims. Further embodiments of the circuit are provided in the dependent claims.

According to one aspect of the present disclosure, a circuit for an artificial neural network (ANN) is provided. The circuit may include an input configured to receive one or more bits whose values are representative of an input value. The input value may for example be an output from an input neuron in a multilayered ANN, or similar.

The circuit may include a sampling circuit connectable to a multibit memory array. The memory array may, for example, be used to store multibit weights used in the ANN, e.g. weights used to produce the input to an output neuron in one layer of the network based on the output from one or more input neurons in a previous layer of the network, as will be described later herein. The sampling circuit may include a sampling capacitor ($C_{sam}$) and may be configured to sample a weight value stored in a memory cell of the multibit memory array. The weight value may be output on a bit line associated with the memory cell. The weight value may be sampled as a voltage across the sampling capacitor. For example, the weight value output from the memory array may be represented as a charge stored in a bit line capacitance for a corresponding column of the memory array in which the weight value is stored. At least a part of this charge may be transferred by the sampling circuit to the sampling capacitor, giving rise to a voltage across the sampling capacitor. As will be described later, the bit line capacitance may be small and the capacitance of the sampling capacitor may be even smaller. Sampling the reading voltage may, for example, include transferring only a fraction of the charge stored in the bit line capacitance to the sampling capacitor. The amount of charge stored in the capacitors may depend on the capacitances, the time to charge, and the voltage across the capacitors.

The circuit may include a capacitance network. The capacitance network may include a plurality of capacitors and a plurality of switching elements connecting the multiple capacitors together, such that the capacitance network can be operated to have a selected capacitance which depends on a configuration of the plurality of switching elements.

The circuit may include at least one buffering circuit. The at least one buffering circuit may be configured to charge, when enabled/connected, the selected capacitance of the capacitance network based on the voltage across the sampling capacitor. For example, the at least one buffering circuit may charge the selected capacitance of the capacitance network such that a voltage there across matches the voltage across the sampling capacitor. The selected capacitance of the capacitance network may be larger than that of the sampling capacitor and the buffering circuit may be allowed to still transfer the voltage as described above by providing additional charge to capacitance network.

The circuit may be further configured to operate the capacitance network, by way of the plurality of switching elements, to a first state wherein the capacitance network has a first selected capacitance and to a second state wherein the capacitance network has a second selected capacitance. At least one of the first selected capacitance and the second selected capacitance may depend on the value of the one or more bits.

The circuit may be further configured to charge, to a first charge, by using the at least one buffering circuit, the capacitance network while the capacitance network is in the first state. After this charging, and after disabling/disconnecting the buffering circuit, the circuit may allow the first charge to be re-distributed within the capacitance network when the capacitance network changes from the first state to the second state, and such that a potential at one or more points within the capacitance network is representative of a scaling of the input value with the weight value. The first selected capacitance and the second selected capacitance may, for example, be different, or equal, as long as the charge is allowed to redistribute. The potential at the one or more points within the capacitance network may, for example, change as a result of moving from the first state to the second state. As described above, the charging to the first charge may be such that a voltage across the capacitance network equals the voltage sampled across the sampling capacitor or at least such that the voltage across the capacitance network has a known proportion to the voltage sampled across the sampling capacitor.

The circuit may further include an output. The output may be configured to provide an output voltage. The output voltage may be representative of the potential at the one or more points. For example, the output may include an output connected to the one or more points. The output voltage may, for example, be defined as the voltage between the output (line) and a reference potential (e.g., a ground or fixed reference voltage). Examples of how the output may be connected to the capacitance network will be given further below, when describing embodiments of the circuit in more detail. As used everywhere herein, if not explicitly stated to the contrary, a "ground" is interchangeable with "fixed reference potential".

A circuit according to the present disclosure may, as will be described in more detail later herein, perform analog multiplication (or scaling) of an input value present on the input with a weight value retrieved (via e.g. a reading voltage) from the memory array without the use of one or more power hungry column ADCs and any multiply and accumulate (MAC) operations within the digital domain. This may allow the benefits of using multibit memories, for instance for an artificial neural network (to store weights connecting neurons in different layers of the network together), by prevailing the reduced memory and area/size requirements offered thereby.

In some embodiments, the plurality of capacitors may include a first set of capacitors. The plurality of switching elements may include a first set of switching elements. The capacitance network may include a plurality of branches connected in parallel. Each branch may include one of the first set of capacitors and one of the first set of switching elements connected in series, such that a selected capacitance of the plurality of branches includes a sum of the capacitance of the capacitors in the branches having their switching elements closed.

In some embodiments, having a first part being is "connected" to a second part does not mean that the two parts are always electrically connected. For example, two parts may be connected using a switching element (such as a transistor), but they may, for example, only be electrically connected once the switching element is closed.

In some embodiments, the circuit may be configured to operate each of the first set of switching elements based on a respective bit of the one or more bits. The capacitance of each of the first set of capacitors may be selected based on a significance of the respective bits. For example, the capacitor connected to the switching element which is to be operated based on the most significant bit may have the largest capacitance and the capacitor connected to the switching element which is to be operated based on the least significant bit may have the smallest capacitance. In other embodiments, the situation may be reversed. By selecting capacitances such that, for example, the smallest value is C, the next value is 2*C, and so on such that the largest value is $2^{n-1}*C$ (where n is the total number bits for the input), the capacitances may match the values of the respective bits when expressed in decimal numbers. In other embodiments, another base rather than base two may be used and the capacitances of the first set of capacitors may be selected accordingly.

In some embodiments, the plurality of switching elements may include a second set of switching elements. The branches may be connected together at points between the capacitor and switching element of each branch by way of one of the second set of switching elements.

In some embodiments, the circuit may further include at least one discharge switching element connected to the plurality of capacitors. The circuit may be configured to discharge at least part of the capacitance network by operating the at least one discharge switching element. For example, each capacitor in the capacitance network may be provided with a respective discharge switching element and the discharge switching element may, for example, be connected such that, when the discharge switching element is closed, charge may escape from the capacitor (e.g., down to ground). In other embodiments, one or more discharge switching elements may each serve more than one capacitor of the plurality of capacitors.

In some embodiments, the sampling circuit may include a sampling transistor. The sampling transistor may be connected in one end to the sampling capacitor and connectable in another end to the bit line of the memory array. The circuit may be configured to sample the weight value by operating the sampling transistor. The sampling transistor may be operable to sample the reading voltage by transferring at least a part of a total charge stored in the bit line capacitance of the memory array, for the bit line belonging to (or representing) the column in which the weight in question is stored, to the sampling capacitor. For example, the sampling transistor may be connectable in one end to at least a bit line capacitor representing the bit line capacitance and connected in another end to the sampling capacitor. For example, one terminal of each of the bit line capacitor and the sampling capacitor may be connected to a respective reference voltage (e.g., a ground, virtual ground, or other fixed potential or potentials) and the remaining terminals of the bit line capacitor and the sampling capacitor may, when the circuit is connected to the memory array, be connected together via the sampling transistor. The sampling circuit may, for example, be a sample-and-hold circuit.

In some embodiments, the sampling transistor may be an IGZO (indium gallium zinc oxide) transistor. An IGZO transistor may, for example, have a lower leakage current therethrough and may partly, or completely, reduce the refreshing of the sample transistor and enable the sample transistor to retain data for biologically plausible time scales.

In some embodiments, a capacitance of the sampling capacitor may be less than 5% of a capacitance of the bit line of the memory array to which the sampling circuit is connectable or connected. In some embodiments, the capacitance of the sampling capacitor may be less than 1% of the capacitance of the bit line.

In some embodiments, the plurality of capacitors may include a multiplication capacitor. The circuit may be configured to operate the capacitance network (by way of the plurality of switching elements) such that the first selected capacitance corresponds to a capacitance of the multiplication capacitor and such that, by operating the first set of switching elements, the second selected capacitance includes or equals a sum of the capacitance of the multiplication capacitor plus the selected capacitance of the plurality of branches. As will be described later herein, this arrangement and operation of the capacitance network may provide a non-linear scaling of the input value with the weight value.

In some embodiments, the circuit may be configured to operate the capacitance network such that, by operating the first set of switching elements, the first selected capacitance corresponds to (e.g. includes or equals) the selected capacitance of the plurality of branches and such that, by connecting all branches together by closing all of the second set of switching elements, the second selected capacitance includes or equals a total capacitance of all of the first set of capacitors. As will be described later herein, this operation of the capacitance network may provide a linear scaling of the input value with the weight value.

According to a second aspect of the present disclosure, a system is provided. The system may include at least one multibit memory array and a plurality of circuits as described herein, for example with reference to the first aspect. The sampling circuit of each circuit may be configured to sample a respective weight value stored in a respective memory cell of the at least one multibit memory array. The outputs of the circuit may be connected together via a second plurality of switching elements. The system may be configured to, after the charge redistribution has occurred within each circuit (i.e., after the first charge has been allowed to re-distribute within the respective capacitance network of the respect circuit), close the second plurality of switching elements such that charge is allowed to be redistributed between the circuits. In some embodiments, a single multibit memory array may be included and serve all of the circuits. In other embodiments, multiple multibit memory arrays are used and that not all circuits are served by the same multibit memory array.

In some embodiments, the circuits may be configured to sample their respective weight values during a same cycle.

In some embodiments, the system may provide parallel processing of input values and weights belonging to a particular row of the memory array, while still maintaining the individual benefits of each circuit as described earlier herein.

In some embodiments, the system may further include an analog-to-digital converter (ADC). The ADC may be configured to read a voltage on the output of at least one circuit. Such a voltage may, after allowing the charge to redistribute between the circuits, correspond to an average or weighted average of terms of input values scaled with their respective weight values.

In some embodiments, the plurality of capacitors may have equal capacitances in all circuits. Phrased differently, the capacitance networks may be equal and a capacitor in one network (i.e. in one circuit) may have a corresponding (equal) capacitor in another network (i.e. in another circuit). This may provide an average of the respective input values scaled with their respective weights of all circuits, which may be read by, for example, the ADC and also stored for later use using, for example, digital memory. In other embodiments, the capacitance networks may be different between the circuits (e.g., have capacitances included therein with different capacitances). Such configurations may provide a different weighting of the averages and the contribution from each circuit may not be included equally in the final sum.

The present disclosure relates to all possible combinations of features recited in the claims. Further, any embodiment described with reference to circuit according to the first aspect may be combinable with any of the embodiments described with reference to the system according to the second aspect, or vice versa.

Further advantages of the various embodiments of the present disclosure will be described below by way of exemplifying embodiments.

Figure 1A:
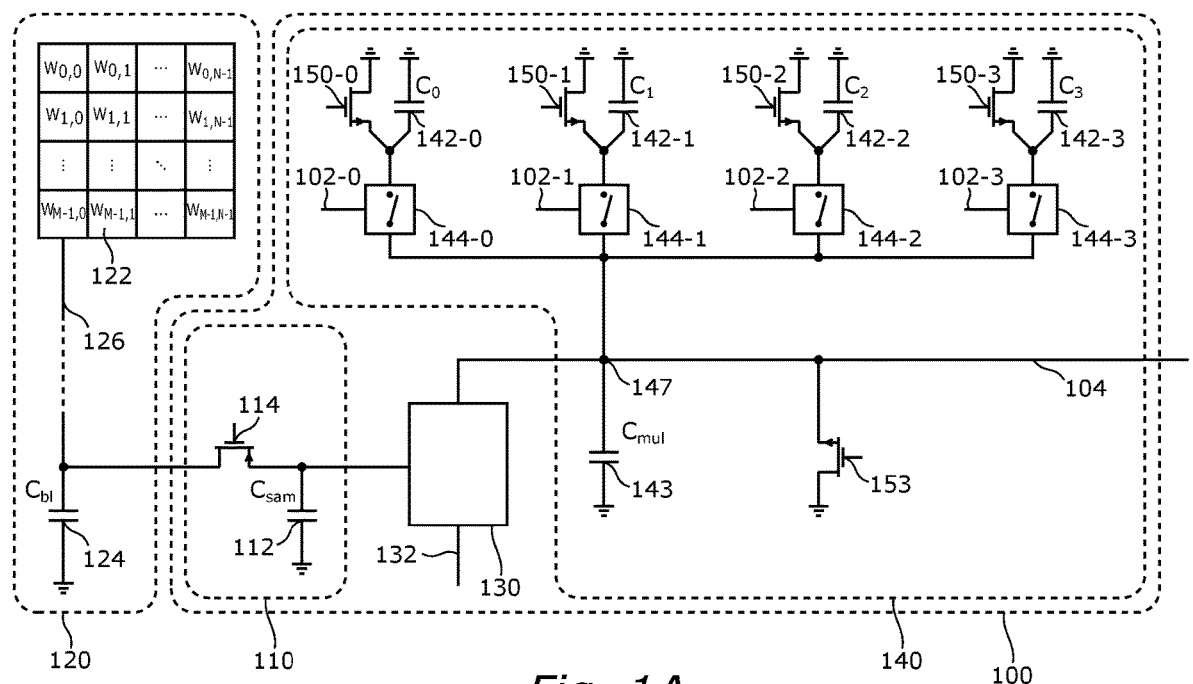
FIG. 1A illustrates schematically an embodiment of a circuit for an artificial neural network, according to example embodiments.

In the drawings, like reference numerals will be used for like elements unless stated otherwise. For elements belonging to the same category, but which may have individually varying properties, reference numerals such as "X–N" will be used, where X remains the same for all elements in the category and where N changes among the elements. In the following description, the reference numeral "X" will be used to address all elements within the category "X", and the reference numeral "X–N" will be used to address a particular element "X–N" within the category "X". Unless explicitly stated to the contrary, the drawings show only such elements that are necessary to illustrate the example embodiments, while other elements, in the interest of clarity, may be omitted or merely suggested. As illustrated in the figures, the sizes of elements and regions may not necessarily be drawn to scale and may be exaggerated for illustrative purposes and, thus, are provided to illustrate the general structures of the embodiments.

DETAILED DESCRIPTION

Exemplifying embodiments will now be described more fully hereinafter with reference to the accompanying drawings. The drawings show some embodiments, but the disclosure herein may, however, be embodied in many different forms and should not be construed as limited to the embodiments set forth herein. Rather, these embodiments are provided for thoroughness, completeness, and fully convey the scope of the present disclosure.

With reference to FIG. 1A, a circuit for an artificial neural network according to embodiments of the present disclosure will now be described in more detail.

FIG. 1A illustrates schematically an embodiment of a circuit 100 connected to a memory array 120. The memory array 120 may form part of the circuit 100 or may be a separate entity to which the circuit 100 (as will be described below) is connectable.

The memory array 120 includes a plurality of memory cells 122 organized in rows and columns in a matrix structure. The memory array 120 may, for example, be a multibit memory array. The word multibit here means that, in contrast to conventional binary memories, each memory cell does not only store a single bit but a plurality of bits. Phrased differently, a memory cell 122 does not only store a logical zero or one, but, for example, a two-, three-, four-(or more) bit number. For example, the memory array 120 may have memory cells 122 which each store a four-bit value (that is, each memory cell 122 may store for example an integer value between 0 and 15 or a decimal number with four-bit precision). The value of such a multibit value may be represented by, for example, a voltage assuming more than two different voltages.

Within the present disclosure, the memory array 120 may be configured such that a particular row may be selected and that a bit line 126 belonging to a particular column may be "activated" or "loaded" with a voltage representative of the value stored in the memory cell located at that particular row and column. This voltage, which may be referred to as a reading voltage, may, for example, correspond to a charge representative of this reading voltage, stored in a bit line capacitance. There may be one physical bit line per memory column or there may be multiple memory columns which share a common bit line using, for example, multiplexing. The bit line capacitance may be represented by a bit line capacitor ($C_{bl}$) 124. It should be noted that the capacitor 124 only serves as a representation of the bit line capacitance and that the capacitor 124 may not necessarily be an actual component. Hence, when referring to a property of the capacitor 124, what is actually referred to is a corresponding property of the bit line capacitance of the corresponding bit line. The inner workings of the memory array, including, for example, how exactly the reading voltage is obtained, what constitutes the actual bit line capacitance, and how to perform charging of the bit line capacitor 124 may be known. The memory array 120 may, for example, be a multibit STT-MRAM, a multibit SOT-MRAM, an OXRAM, a crossbar memory device, or other similar devices.

The circuit 100 includes a sampling circuit 110 which is connectable (or connected) to the memory array 120. The sampling circuit 110 may sample the reading voltage from the memory array 120 as a voltage across a sampling capacitor 112. As explained above, the sampled reading voltage may be representative of a multibit value stored in a memory cell 122. Herein, with reference to artificial neural networks and as will be described further below, the value may be a multibit weight for a neuron connection in such a network.

The sampling circuit 110 may, for example, be a sample-and-hold circuit, where the reading voltage is sampled across the sampling capacitor 112 by turning on a sampling transistor 114, which connects an upper (as illustrated in FIG. 1) end of the sampling capacitor 112 with an upper end of the bit line capacitor 124. In some embodiments, such a transistor may be an IGZO transistor, but other transistors may also be used (e.g., NMOS, PMOS, NMOS-PMOS transistors, or others). In some embodiments, it the capacitance of the sampling capacitor 112 is much smaller than that of the bit line capacitor 124. For example, the capacitance of the sampling capacitor 112 may be less than 5%, or in some embodiments less than 1%, of the capacitance of the bit line capacitor 124. The lower terminals of both the sampling capacitor 112 and the bit line capacitor 124 may, for example, be connected to a ground, or to some other fixed/reference voltage or potential.

The circuit 100 includes a capacitance network 140, including a plurality of capacitors 142, 143 and a plurality of switching elements 144 connecting the plurality of capacitors 142, 143 together. The capacitor 143 is referred to as a multiplication capacitor and has a capacitance $C_{mul}$, while the remaining capacitors 142-0 to 142-3 (with respective capacitances $C_0$, $C_1$, $C_2$, $C_3$) are arranged together with a respective switching element 144-0 to 144-3 in a plurality of parallel branches. In each branch, the respective capacitor 142-0 to 142-3 is connected in series with the respective switching element 144-0 to 142-3. The capacitors 142-0 to 142-3 form part of a first set of capacitors and the switching elements 144-0 to 144-3 form part of a first set of switching elements. In the circuit 100 illustrated in and described with reference to FIG. 1A, each one of the capacitors 142-0 to 142-3, 143 is provided with a corresponding discharge switching element 150-0 to 150-3, 153, which is provided in parallel with the respective capacitor such that the capacitor may be discharged by providing a control signal to the discharge switching element. The discharge switching elements 150 and 153 may, for example, be transistors and the control signals may, for example, be signals provided on the gate/base of such a transistor, from, for example, a controller of the circuit (not shown).

Each switching element 144-0 to 144-3 is provided with a respective control signal via input lines 102-0 to 102-3. The control signals may, for example, be the input to the circuit 100 such that a voltage indicative of a respective bit of the input value received on the input is provided to a respective switching element 144-0 to 144-3. In some embodiments, the input 102 is not directly connected to the switching elements 144 but instead the control signals to the switching elements 144 are provided in other ways by the circuit 100 (e.g., using a controller, not shown) but still based on the input 102 and the bits thereof.

Together, the various switching elements 144 and capacitors 142, 143 form a capacitance network 140 which may be operated by the circuit 100 (e.g., using a controller or directly based on the bits of the input) to have a selected capacitance which depends on a configuration of the switching elements 144. For example, by closing all of the switching elements 144 except the switching elements 144-1 and 144-2, the selected capacitance of the capacitance network 140 (e.g., if measured between the node 147 and a reference potential such as ground) would correspond to $C_{mul}+C_2+C_3$. In another example, the selected capacitance may be $C_{mul}$ if all of the switching elements 144 are opened.

The circuit 100 further includes a buffering circuit 130. The buffering circuit 130 is connected between the sampling circuit 110 and the capacitance network 140 and is configured to receive a control signal 132. Based on the control signal 132, the buffering circuit may connect or disconnect the capacitance network 140 from the sampling capacitor 112. The buffering circuit 130 may, in a controlled way, copy voltage from the sampling capacitor 112 to the capacitance network 140 such that the selected capacitance of the capacitance network 140 may be charged to a voltage which depends on the voltage sampled across the sampling capacitor 112. For example, the sampling circuit 110 may first sample the reading voltage of the bit line 126 as a voltage across the sampling capacitor 112. Once the voltage across the sampling capacitor 112 has settled down, the buffering circuit 130 may be activated (e.g. by providing a control signal 132) such that the voltage across the sampling capacitor 112 may be established or transferred as a voltage across the capacitance network 140 (e.g., as a voltage between the node 147 and ground). To provide enough charge to raise the voltage across the capacitance network 140, the buffering circuit 130 may include further circuitry (not shown), such as, for example, a current source.

The circuit further includes an output 104, which is connected to the node 147 such that a voltage on the output 104 may be representative of a potential at the node 147.

Figure 3:
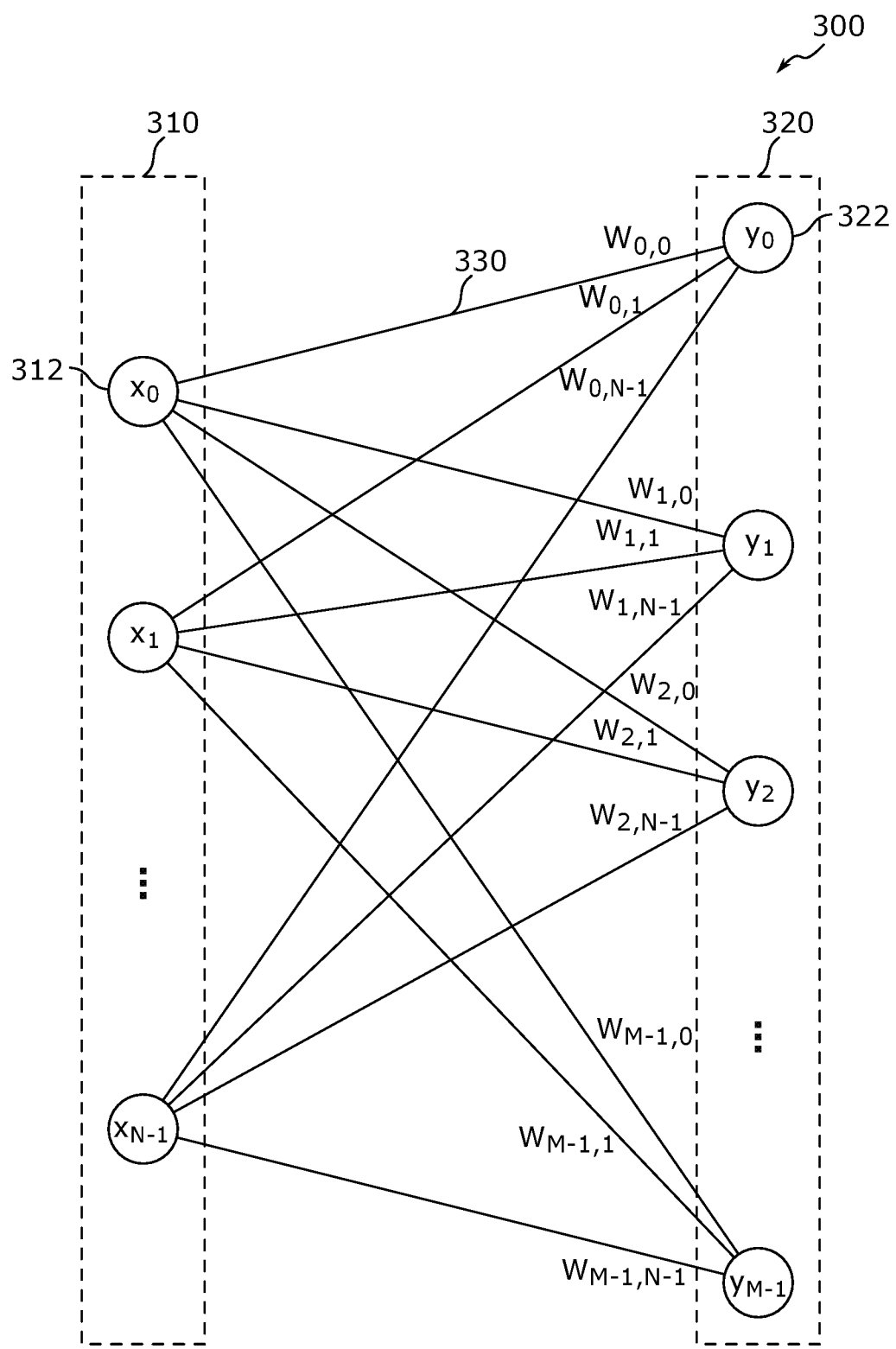
FIG. 3 illustrates schematically an example of an artificial neural network, according to example embodiments.

With further reference to FIG. 3, the functioning of the circuit 100 will now be described in more detail.

FIG. 3 illustrates schematically an example of an artificial neural network 300, including an input layer 310 with a plurality of input neurons 312 (with outputs $x_0$, $x_1$, ..., $x_{N-1}$), where N is the total number of input neurons 312. The network also includes an output layer 320 including a plurality of output neurons 322 (with total inputs $y_0$, $y_1$, ..., $y_{M-1}$), where M is the total number of output neurons 322. The output neurons 322 in the output layer 320 are connected to the input neurons 312 of the input layer 310 using a plurality of connections 330 each having a corresponding weight $w_{i,j}$, such that the output of an input neuron 312 serves as an input to all the output neurons to which the particular input neuron is connected. The total input $y_i$ to a particular output neuron from the outputs $x_j$ of the input neurons 312 may be found using a propagation function which may, for example, have the form $y_i=\Sigma_j w_{i,j}x_j$. Phrased differently, the total input to each output neuron may be found as a weighted sum of the outputs of the input neurons. Based on its total input, each output neuron may then output an output value. Put differently, the total input to the output neuron is filtered and the value output by a neuron in the output layer 320 may be provided as an input to another neuron located in a further layer (not shown) of the network. The neural network may be "trained" by iteratively updating the weights of the connections until it is found that a typical output from the input neurons (e.g., from one or more sensors or from earlier layers of neurons in the ANN) will result in an expected output from the output neurons. Further details about, and other potential arrangements of, artificial neural networks may be known to those skilled in the art.

The weights $w_{i,j}$ may be stored in the memory array 122, such that, for example, one weight $w_{i,j}$ is stored in a memory cell 122 located on row i and in column j of the memory array 122.

In the circuit 100, the output from a particular input neuron may be presented as an input value to the circuit 100 on the input (lines) 102-0 to 102-3 (e.g., if the output from the input neuron and the input value to the circuit 100 is a four-bit value). The binary representation of the input value presented on the input 102 may be "$A_0A_1A_2A_3$", where $A_j$ is the value of the respective bit (i.e. "0" or "1"). Phrased differently, if $A_j$ is "high" (or "1"), the corresponding switching element 144-j may be activated (or closed). Likewise, if $A_j$ is "low" (or "0"), the corresponding switching element 144-j may be deactivated (or opened). The significance of the bits may, for example, be such that $A_0$ is the most significant bit, or e.g. such that $A_0$ is the least significant bit.

The memory array 120 may be instructed to present a reading voltage indicative of the value of a particular weight stored on a particular row and in a particular column. The reading voltage may be output on the bit line 126 corresponding to the particular column, for example, as a corresponding charge stored in the bit line capacitance 124.

Before a first cycle, the discharge switching elements 150 and 153 are activated (or closed) to refresh/discharge the multiplication capacitor 143 and the capacitors 142-0 to 142-3. The discharge switching elements 150 and 153 are then deactivated (opened). Meanwhile, by way of a control signal 132, the buffering circuit 130 may disconnect the capacitance network 140 from the sampling capacitor 112.

During the first cycle, the reading voltage is sampled across the sampling capacitor 112 by activation of the switch/transistor 114.

The capacitance network 140 is operated to a state in which only the multiplication capacitor 143 is connected, by opening all of the switching elements 144-0 to 144-3. This configuration of the capacitance network 140 may correspond to a first state, which may not depend on the particular input 102 to the system. The selected capacitance of the capacitance network 140 may be the capacitance of the multiplication capacitor 143 (i.e., $C_{mul}$).

Once the voltage across the sampling capacitor 112 has been allowed to settle down and once the capacitance network 140 has been operated to be in the first state, the capacitance network 140 may be reconnected to the buffering circuit 130 and the voltage across the sampling capacitor 112 may be established/transferred by the buffering circuit 130 to a voltage $V_{mul}$ across the multiplication capacitor 143. The capacitance of, for example, the multiplication capacitor 143 (and of the capacitance network 140) may be larger than the capacitance of the sampling capacitor 112, as the buffering circuit 130 may, when enabled, provide sufficient extra current to charge that capacitance such that the transferred voltage equals the sampled voltage. Phrased differently, the buffering circuit 130, when enabled, charges the selected capacitance of the capacitance network 140 based on the voltage across the sampling capacitor 112.

Once the selected capacitance is fully charged to a level based on the voltage across the sampling capacitor, the buffering circuit may no longer be enabled. The charge can then be maintained on the selected capacitance for further use during the re-distribution of charge in the following cycle(s). This is the case during the re-distribution of charge in any of the embodiments of the circuit according to the present disclosure. The buffering circuit can be disabled/enabled or disconnected/connected from the selected capacitance of the capacitance network 140, based on, for example, the control signal 132 and by further use of, for example, one or more switching elements, a pass-gate or by placing the output of the buffer in tri-state or not.

The circuit 100 may be configured to then activate (close) the switching elements 144-0 to 144-3 based on the values of the bits received on the input 102. This will operate the capacitance network 140 to a second state, which depends on the configuration of the switching elements 144-0 to 144-3 (i.e., on the input). The selected capacitance of the capacitance network 140 may be decided by the value of the bits.

Before the activation (of the switching elements), the multiplication capacitor 143 may be charged and the total charge before activation may be $Q_{before}=V_{mul}C_{mul}$. After the activation, the capacitors 142-0 to 142-3 may be connected based on the value of the bits such that the selected capacitance of the capacitance network 140 is $A_0C_0+A_1C_1+A_2C_2+A_3C_3+C_{mul}$. As the capacitance network 140 moves from the first state to this second state, charge will be allowed to redistribute within the capacitance network 140. After settling down, the voltage between the node (or point) 147 of the capacitance network 140 and ground will change (scale) to a new voltage $V_{scale}$, and the total charge among the capacitors of the capacitance network 140 will be $Q_{after}=V_{scale}(A_0C_0+A_1C_1+A_2C_2+A_3C_3+C_{mul})$. By charge conservation, the total charge before activation may equal the total charge after activation, resulting in $V_{scale}=V_{mul}C_{mul}/(A_0C_0+A_1C_1+A_2C_2+A_3C_3+C_{mul})$.

More generally, if the capacitance network 140 includes an arbitrary number J of branches and if the input 102 is configured to receive an input value represented using J bits, the scaled voltage may be expressed as $V_{scale}=V_{mul}C_{mul}/(C_{mul}+\Sigma_j A_j C_j)$, where the sum is taken over all branches (j=0 to J-1). As an example, the various capacitances may be selected such that $C_{mul}=C$, $C_0=C$, $C_1=2C$, $C_2=4C$ and $C_3=8C$. For example, an input value of "5", represented binary as $A_0=1$, $A_1=0$, $A_2=1$ and $A_3=0$ (e.g., if $A_0$ is taken to represent the least significant bit and $A_3$ the most significant bit), would then correspond to a scaled voltage $V_{scale}=V_{mul}/(1+1+4)=V_{mul}/6$. Likewise, an input value of e.g. "15", represented binary as $A_0=1$, $A_1=1$, $A_2=1$ and $A_3=1$, would correspond to a scaled voltage $V_{scale}=V_{mul}/(1+1+2+4+8)=V_{mul}/16$. Further, an input value "0" would give $V_{scale}=V_{mul}/1$ and an input value of "1" would give $V_{scale}=V_{mul}/2$, and so on and so forth.

As the voltage $V_{mul}$ is equal to or at least proportional to the reading voltage and thereby the value of the weight, the circuit 100 allows the calculation of a weighting, or scaling, of an input value with a weight value. As the output 104 is connected to the upper end of the multiplication capacitor 143, at the node 147, the output 104 may present a voltage representative of $V_{scale}$ and thereby representative also of the result of the weighing (or scaling) of the input with the weight value. As no ADCs or digital multiply and accumulate (MAC) operations are present, the circuit 100 enables the use of multibit memory in artificial neural networks with prevailing benefits of both reduced space and energy requirements.

As the weight obtained from the memory array is scaled with the inverse of the input value (plus an additional constant, offset term), the operation of the circuit 100 is non-linear. However, such an operation may still be valuable if using, for example, tan h or sigmoid filtering within a neuron.

Figure 1B:
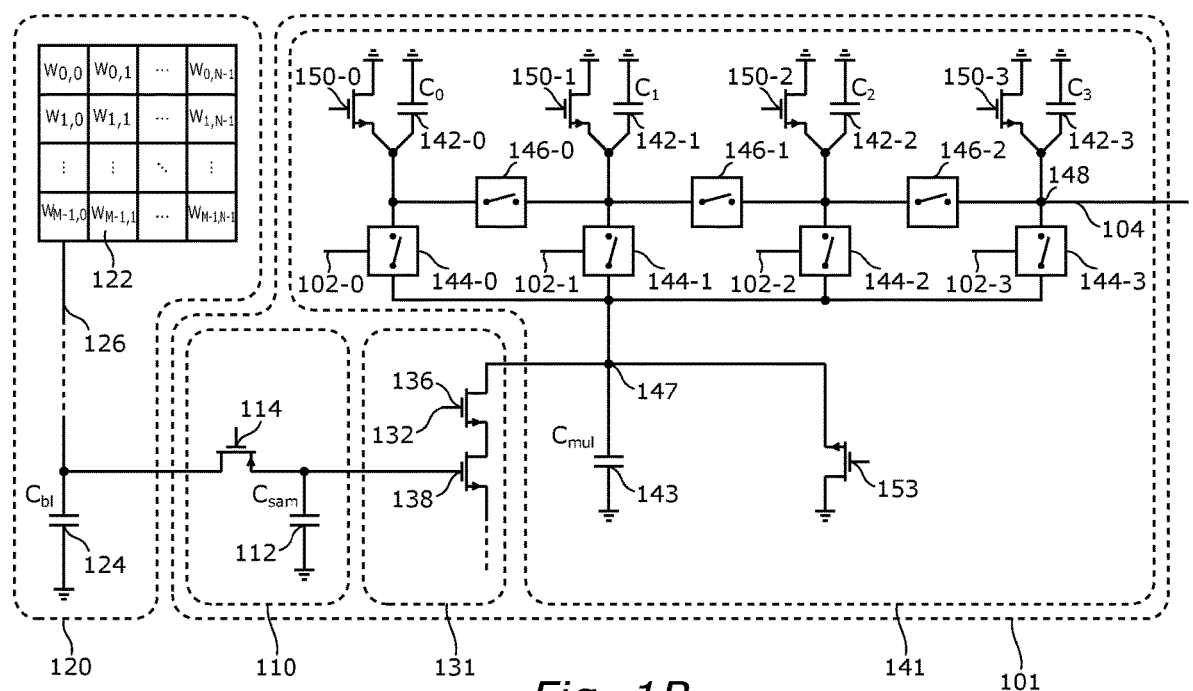
FIG. 1B illustrates schematically an embodiment of a circuit for an artificial neural network, according to example embodiments.

With reference to FIG. 1B, another embodiment of a circuit for an artificial neural network according to the present disclosure will be described in more detail.

FIG. 1B illustrates schematically a circuit 101. Many of the components of the circuit 101 are similar or equal to those already described with reference to the circuit 100 shown in FIG. 1A. As such, differences between the circuits 100 and 101 will be noted in the following description.

In the circuit 101, in the capacitance network 141, the branches including the various capacitors 142-0 to 142-3 and switching elements 144-0 to 144-3 are connected together at points between the respective capacitor and switching element in each branch. This is done by provision of further switching elements 146-0 to 146-2. The further switching elements 146-0 to 146-2 also belong to the plurality of switching elements and forms a second set of switching elements. In the circuit 101, the output 104 is connected to a point/node 148 (e.g., between a respective capacitor and switching element in a branch) on the rightmost branch including the capacitor 142-3. In other embodiments, the output 104 may be connected at such a point of another branch or at other points where the same functionality of the output 104 may be obtained (i.e., where a voltage on the output 104 is representative of a potential at the point 148).

In the embodiment of the circuit 101 described with reference to FIG. 1B, the buffering circuit 131 includes a pair of transistors 136, 138, which in turn are connected to further circuitry (not shown) such as, for example, a current source. The buffering circuit 131 may, for example, disconnect the capacitance network 141 from the sampling capacitor 112 using the transistor 136 and based on the control signal 132 provided on the gate/base of the transistor 136. The flow of current from the current source may be controlled by the voltage across the sampling capacitor 112, as provided on the gate/base of the transistor 138. In other embodiments of the circuit according to the present disclosure, the buffering circuit 131 may be configured in other ways. These other embodiments may have the same ability to charge the capacitance network 141 based on the voltage across the sampling capacitor 112 in a controlled way.

The second set of switching elements 146-0 to 146-2 is configured to be controlled by a same signal (not shown).

The functioning of the circuit 101 will now be described in more detail. In the embodiment described below, multiplication capacitor 143 is not included in the capacitance network 141.

As already described with reference to the circuit 100 as illustrated in FIG. 1A, a reading voltage corresponding to a value of a specific (multibit) weight stored in a specific memory cell 122 of the memory array 120 may be transferred, using the sampling circuit 110, to a voltage across the sampling capacitor 112 and further (using the buffering circuit 131 after having discharged the first set of capacitors 142 using the discharge switching elements 150) to a voltage across the capacitance network 141 (i.e., a voltage $V_{mul}$ between the node 147 and a ground or other reference potential).

Before this charging of the capacitance network 141, the first set of capacitors 142-0 to 142-3 may be used to operate the capacitance network 141 to a first state, where a selected capacitance of the capacitance network 141 depends on the input value received on the input 102. In this first state, the selected capacitance of the capacitance network 141 may equal $A_0C_0+A_1C_1+A_2C_2+A_3C_3$. After this charging, the total charge in the capacitance network 141 may equal $Q_{before}=V_{mul}{}^x(A_0C_0+A_1C_1+A_2C_2+A_3C_3)$, where $V_{mul}$ is the voltage transferred by the buffering circuit 131 and "$A_0A_1A_2A_3$" may represent the binary representation of the input value received on the input 102.

The circuit may then, after disabling/disconnecting the buffering circuit 131 and by closing all of the second set of switching elements 146-0 to 146-2 and thereby connecting all of the parallel branches together, operate the capacitance network 141 to a second state where the selected capacitance is $C_0+C_1+C_2+C_3$. When moving from the first state to the second state, charge may redistribute within the network, and a voltage $V_{scale}$ may be present between the point 148 and a ground. After this voltage has settled down, the total charge of the capacitance network may equal $Q_{after}=V_{scale}{}^x(C_0+C_1+C_2+C_3)$. By charge conservation, $Q_{after}$ may equal $Q_{before}$, which in turn corresponds to $V_{mul}{}^x(A_0C_0+A_1C_1+A_2C_2+A_3C_3)=V_{scale}{}^x(C_0+C_1+C_2+C_3)$ (i.e., such that $V_{scale}=V_{mul}{}^x(A_0C_0+A_1C_1+A_2C_2+A_3C_3)/(C_0+C_1+C_2+C_3)$).

More generally, in the circuit 101, if an arbitrary number J of branches and corresponding number of bits are received on the input 102, the voltage on the output 104 may be expressed as $V_{scale}=V_{mul}{}^x(\Sigma_j A_j C_j)/(\Sigma_j C_j)$, where the sum is taken over all branches (j=0 to J−1).

In contrast to the circuit 100 described with reference to FIG. 1a, the circuit 101 may provide a linear scaling (multiplication) of a multibit input value with a specific weight value stored in the memory array, still while obtaining the same benefits without ADC or digital MAC operations. Such linear operation may be used. for ReLU type filtering linear activation in neurons.

In the above description of the function of the circuit 101, the multiplication capacitor 143 may not be connected. Phrased differently, the multiplication capacitor 143 (and its corresponding discharge switching element 153) may be optional in the circuit 101. If the multiplication capacitor 143 is used, a modified functioning of the circuit 101 may occur. For example, the first state of the capacitance network 141 may be such that both the multiplication capacitor 143 and the first set of capacitors 142-0 to 142-3 are connected (e.g., based on the bits of the input value received on the input 102 as described earlier herein). In the first state, the total capacitance of the capacitance network 141 may be $A_0C_0+A_1C_1+A_2C_2+A_3C_3+C_{mul}$. After the charging of the capacitance network 141 to the voltage $V_{mul}$, the total charge in the capacitance network 141 may equal $Q_{before}=V_{mul}{}^x(A_0C_0+A_1C_1+A_2C_2+A_3C_3+C_{mul})$. The circuit may then, by closing all of the second set of switching elements 146-0 to 146-2 and thereby connecting all of the parallel branches together, operate the capacitance network 141 to a second state where the selected capacitance is $C_0+C_1+C_2+C_3+C_{mul}$. When moving from the first state to the second state, charge may redistribute within the network and a voltage $V_{scale}$ may be present between the point 148 and a ground. After this voltage has settled down, the total charge of the capacitance network equals $Q_{after}=V_{scale}{}^x(C_0+C_1+C_2+C_3+C_{mul})$. By charge conservation, $Q_{after}$ may equal $Q_{before}$, which in turn corresponds to $V_{mul}{}^x(A_0C_0+A_1C_1+A_2C_2+A_3C_3+C_{mul})=V_{scale}{}^x(C_0+C_1+C_2+C_3+C_{mul})$ (i.e., such that $V_{scale}=V_{mul}{}^x(A_0C_0+A_1C_1+A_2C_2+A_3C_3+C_{mul})/(C_0+C_1+C_2+C_3+C_{mul})$).

More generally, in the circuit 101, if using the multiplication capacitor 143 and if an arbitrary number J of branches and corresponding number of bits are received on the input 102, the voltage on the output 104 may be expressed as $V_{scale}=V_{mul}(C_{mul}+\Sigma_j A_j C_j)/(C_{mul}+\Sigma_j C_j)$, where the sum is taken over all branches (j=0 to J−1). Consequently, using the multiplication capacitor 143 in the circuit 101 also provides a linear scaling, but with an offset term ($C_{mul}$) in both the nominator and denominator. This may be useful depending on the filtering used in an output node of the network.

Within the scope of the present disclosure, other sequences of opening or closing of the plurality of capacitors and plurality of switching elements can generate other results which may also be useful for artificial neural networks and may include linear or non-linear scaling or multiplication of a particular weight with a particular input term.

Figure 2:
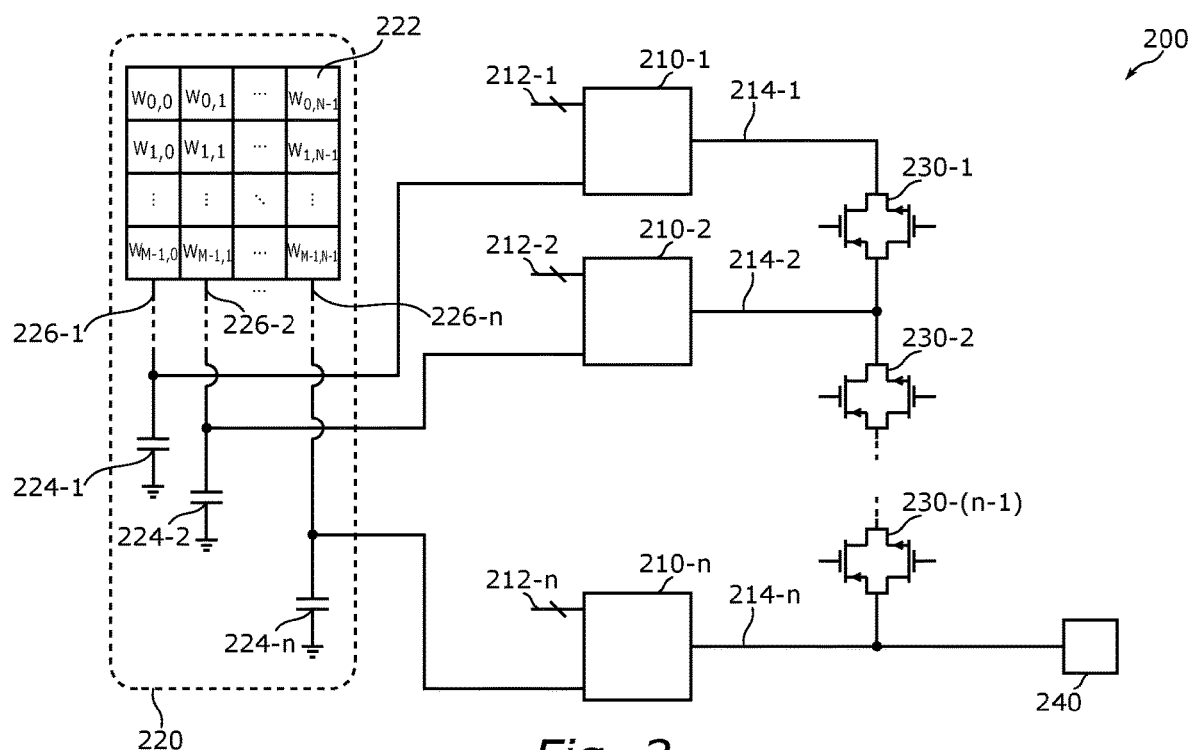
FIG. 2 illustrates schematically an embodiment of a system, according to example embodiments.

With reference to FIG. 2, an embodiment of a system according to the present disclosure will now be described in more detail.

FIG. 2 illustrates schematically a system 200. The system 200 includes a memory array 220, including a plurality of memory cells 222 arranged in rows and columns to form a matrix structure. The memory array 220 may, for example, be a multibit memory array. Each memory cell 222 may store a multibit weight value. The memory array 220 may be similar or equal to the memory array 120 described earlier herein with reference to FIG. 1A or 1B. For each column of the memory array 220, a bit line 226-1 to 226-n is provided which includes a respective bit line capacitance represented by a respective bit line capacitor 224-1 to 224-n. The system 200 further includes a plurality of circuits 210-1 to 210-n, according to the various embodiments described herein, where each circuit is connected to a respective bit line such that the sampling circuit of each circuit 210-1 to 210-n may sample a reading voltage output from the respective bit line 226-1 to 226-n, or in some embodiments across the corresponding bit line capacitors 224-1 to 224-n. As mentioned earlier herein, the bit line capacitors 224-1 to 224-n may not necessarily be actual components, but rather may represent a respective bit line capacitance.

As described earlier herein, each circuit is provided with a corresponding input 212-1 to 212-n.

In the system 200, respective outputs 214-1 to 214-n of the circuits 210-1 to 210-n are interconnected such that the circuits form a chain. In the system 200, the interconnection of the outputs 214 of the circuits 210 is achieved by a second plurality of switching elements 230-1 to 230-(n-1). Here, each of the second plurality of switching elements 230 is a parallel pair of transistors (forming a pass-gate). This may occur during full swing operation, but in some embodiments the switching elements 230 may each include a single transistor or at least some of the switching elements 230 may include only a single transistor. By closing the second plurality of switching elements 230, charge may be redistributed between the circuits 210.

The system 200 further includes an analog-to-digital converter (ADC) 240 which is connected to measure/read a voltage or potential at the output 214-n of the last circuit 210-n (or, in addition or instead, at another one of the outputs 214).

The system 200 may allow for parallel scaling/multiplication of input values with weights stored in a same row of the memory array 220. For example, if the memory array 220 includes M-1 rows and N-1 columns, each one of the n circuits (where n=N) of the system 200 may receive a respective input value (e.g., such that the input value $x_j$ is received on the input 212-j of the circuit 210-j, where j is an integer between 0 and n-1). Each circuit may scale/multiply its input value with a corresponding weight $w_{i,j}$ found in the memory cell on row i and in column j of the memory array 220 and output the resulting value of the scaling/multiplication on the respective output 214-j. The second plurality of switching elements 230-1 to 230-(n-1) may then be activated (closed) such that charge is allowed to be redistributed between the circuits. If the capacitance networks of the circuits 210 are equal, each of the capacitance networks may receive an average charge. This average charge may be read out by the ADC 240, and in some embodiments may be stored for later use or output from the system. Using the notation introduced earlier, this output may correspond to the total input to an output neuron and may correspond to a weighted sum of all outputs from the input neurons with their corresponding weights. If the system 200 forms part of a neuron, this total input may be filtered by the receiving output neuron. In some embodiments, the memory array may have fewer columns than the total number of input neurons. In such a case, the weights for a same output neuron may be stored across multiple rows or in multiple memory arrays. The system 200 may then still calculate a partial sum of the input values and weights stored within a single row, read the partial sum out using the ADC 240 and store it in, for example, a digital memory. The system 200 may then proceed with the next row of the memory array 220 to fetch the remaining weights, present the remaining input values on the respective inputs of the respective circuits, and continue to calculate the remaining terms of the sum. The result may once again be read by the ADC 240 and combined with the previously stored partial sum in order to form the complete sum. Phrased differently, a system according to the present disclosure may, after at least one run for each row in the memory array, calculate matrix products such as y=Wx, where y and x are column vectors containing the total input values to the output neurons and the output values from the input neurons, respectively, and where W is a matrix containing the weights connecting the input and output neurons together. This may be helpful when constructing an artificial neural network In general, the circuits (and systems including such circuits) described within the present disclosure enables efficient use of (multibit) memory architectures in artificial neural networks. This is achieved without including one or more ADCs per memory column in order to read out the weights stored therein, which in turn eliminates the power and area otherwise used to operate such ADCs. In addition, the use of space/area as well as energy consuming MAC operations in the digital domain is also avoided. The circuits as presented herein enable both (non-linear) scaling and multiplication of input values and corresponding weights stored in the memory array.

The present disclosure is not intended to be limited to the embodiments described above. On the contrary, many modifications and variations are possible within the scope of the appended claims.

Although features and elements are described above in particular combinations, each feature or element may be used alone without the other features and elements or in various combinations with or without other features and elements.

Additionally, variations to the disclosed embodiments can be understood and effected by those practicing the claimed invention, from a study of the drawings, the disclosure, and the appended claims. In the claims, the word "comprising" does not exclude other elements, and the indefinite article "a" or "an" does not exclude a plurality. The mere fact that certain features are recited in mutually different dependent claims does not indicate that a combination of these features cannot be used to advantage.

What is claimed is:

1. A circuit for an artificial neural network, comprising:
an input configured to receive one or more bits whose values are representative of an input value;
a sampling circuit connectable to a multibit memory array, wherein the sampling circuit includes a sampling capacitor, wherein the sampling circuit is configured to sample a weight value stored in a memory cell of the multibit memory array and output the weight value on a bit line associated with the memory cell, and wherein the weight value is sampled as a voltage across the sampling capacitor;
a capacitance network including a plurality of capacitors and a plurality of switching elements connecting the plurality of capacitors together, wherein the capacitance network is operable to have a selected capacitance that depends on a configuration of the plurality of switching elements;
at least one buffering circuit configured to charge the selected capacitance of the capacitance network based on the voltage across the sampling capacitor; and
a controller configured to:
operate, by configuring the plurality of switching elements, the capacitance network to a first state and to a second state, wherein the capacitance network has a first selected capacitance when in the first state, wherein the capacitance network has a second selected capacitance when in the second state, and wherein at least one of the first selected capacitance and the second selected capacitance depend on the values of the one or more bits;
charge to a first charge, by using the at least one buffering circuit, the capacitance network while the capacitance network is in the first state; and
after the charging and with the at least one buffering circuit disabled or disconnected from the selected capacitance, allow the first charge to be redistributed within the capacitance network when the capacitance network changes from the first state to the second state, wherein the charge redistribution is such that a potential at one or more points within the capacitance network is representative of a scaling of the input value with the weight value, and
wherein the circuit further comprises an output configured to provide an output voltage representative of the potential at the one or more points.

2. The circuit of claim 1, wherein the plurality of capacitors includes a first set of capacitors, wherein the plurality of switching elements includes a first set of switching elements, and wherein the capacitance network includes a plurality of branches connected in parallel, each branch including a capacitor of the first set of capacitors and a switching element of the first set of switching elements connected in series, such that a selected capacitance of the plurality of branches includes a sum of the capacitances of the capacitors in the branches having their switching elements closed.

3. The circuit of claim 2, wherein the circuit is configured to operate each of the first set of switching elements based on a respective bit of the one or more bits, and wherein a capacitance of each of the first set of capacitors is selected based on a significance of the respective bit.

4. The circuit of claim 2, wherein the plurality of switching elements includes a second set of switching elements, and wherein the plurality of branches are connected together at points between the capacitor and the switching element of each branch by way of one of the second set of switching elements.

5. The circuit of claim 4, wherein the circuit is configured to operate the capacitance network such that, by configuring the first set of switching elements, the first selected capacitance includes the selected capacitance of the plurality of branches, and such that, by connecting all of the plurality of branches together by closing all of the second set of switching elements, the second selected capacitance includes a total capacitance of all of the first set of capacitors.

6. The circuit of claim 2, wherein the plurality of capacitors includes a multiplication capacitor, and wherein the circuit is configured to operate the capacitance network such that the first selected capacitance corresponds to a capacitance of the multiplication capacitor, and such that, by configuring the first set of switching elements, the second selected capacitance includes a sum of the capacitance of the multiplication capacitor plus the selected capacitance of the plurality of branches.

7. The circuit of claim 1, further comprising at least one discharge switching element connected to the plurality of capacitors, wherein the circuit is configured to discharge at least part of the capacitance network by operating the at least one discharge switching element.

8. The circuit of claim 1, wherein the sampling circuit includes a sampling transistor connected in one end to the sampling capacitor and connected in another end to the bit line of the multibit memory array, wherein the circuit is configured to sample the weight value by operating the sampling transistor.

9. The circuit of claim 8, wherein the sampling transistor is an indium-gallium-zinc-oxide transistor.

10. The circuit of claim 1, wherein a capacitance of the sampling capacitor is less than 5% of a capacitance of the bit line associated with the memory cell of the multibit memory array.

11. A system forming part of a neuron of an artificial neural network comprising:
at least one multibit memory array; and
a plurality of circuits, each circuit comprising:
an input configured to receive one or more bits whose values are representative of an input value;
a sampling circuit connectable to a multibit memory array, wherein the sampling circuit includes a sampling capacitor, wherein the sampling circuit is configured to sample a weight value stored in a memory cell of the multibit memory array and output the weight value on a bit line associated with the memory cell, and wherein the weight value is sampled as a voltage across the sampling capacitor;
a capacitance network including a plurality of capacitors and a plurality of switching elements connecting the plurality of capacitors together, wherein the capacitance network is operable to have a selected capacitance that depends on a configuration of the plurality of switching elements;
at least one buffering circuit configured to charge the selected capacitance of the capacitance network based on the voltage across the sampling capacitor; and
a controller configured to:
operate, by configuring the plurality of switching elements, the capacitance network to a first state and to a second state, wherein the capacitance network has a first selected capacitance when in the first state, wherein the capacitance network has a second selected capacitance when in the second state, and wherein at least one of the first selected capacitance and the second selected capacitance depend on the values of the one or more bits;

charge to a first charge, by using the at least one buffering circuit, the capacitance network while the capacitance network is in the first state; and after the charging and with the at least one buffering circuit disabled or disconnected from the selected capacitance, allow the first charge to be redistributed within the capacitance network when the capacitance network changes from the first state to the second state, wherein the charge redistribution is such that a potential at one or more points within the capacitance network is representative of a scaling of the input value with the weight value, and wherein the circuit further comprises an output configured to provide an output voltage representative of the potential at the one or more points, wherein the input to each circuit of the plurality of circuits correspond to neuron inputs to the neuron, wherein the sampling circuit of each circuit of the plurality of circuits is configured to sample a respective weight value stored in a respective memory cell of the at least one multibit memory array, and wherein the outputs of the plurality of circuits are connected together via a second plurality of switching elements, and wherein the system is configured to, after the charge redistribution has occurred within each circuit of the plurality of circuits, close the second plurality of switching elements such that charge is allowed to redistribute between the plurality of circuits, and such that a voltage on the output of at least one circuit of the plurality of circuits corresponds to at least a partial sum of the input value on each circuit of the plurality of circuits scaled with its respective weight value.

12. The system of claim 11, wherein the plurality of circuits are each configured to sample their respective weight values during a same cycle.

13. The system of claim 11, further comprising an analog-to-digital converter configured to read the voltage on the output of at least one circuit of the plurality of circuits.

14. The system of claim 11, wherein the plurality of capacitors have equal capacitances in all of the plurality of circuits.

15. A method implemented by a controller of a circuit, the circuit comprising a capacitance network including a plurality of capacitors and a plurality of switching elements connecting the plurality of capacitors together, wherein the capacitance network is operable to have a selected capacitance that depends on a configuration of the plurality of switching elements, the method comprising:

operating, by configuring the plurality of switching elements, the capacitance network to a first state and to a second state, wherein the capacitance network has a first selected capacitance when in the first state, wherein the capacitance network has a second selected capacitance when in the second state, wherein the circuit includes an input configured to receive one or more bits whose values are representative of an input value, and wherein at least one of the first selected capacitance and the second selected capacitance depend on the values of the one or more bits;

charging to a first charge, by using at least one buffering circuit, the capacitance network while the capacitance network is in the first state, wherein the circuit includes a sampling circuit connectable to a multibit memory array, wherein the sampling circuit includes a sampling capacitor, wherein the sampling circuit is configured to sample a weight value stored in a memory cell of the multibit memory array and output the weight value on a bit line associated with the memory cell, wherein the weight value is sampled as a voltage across the sampling capacitor, and wherein the at least one buffering circuit is configured to charge the selected capacitance of the capacitance network based on the voltage across the sampling capacitor; and after the charging and with the at least one buffering circuit disabled or disconnected from the selected capacitance, allowing the first charge to be redistributed within the capacitance network when the capacitance network changes from the first state to the second state, wherein the redistribution is such that a potential at one or more points within the capacitance network is representative of a scaling of the input value with the weight value, and wherein the circuit further comprises an output configured to provide an output voltage representative of the potential at the one or more points.

16. The method of claim 15, wherein the plurality of capacitors includes a first set of capacitors, wherein the plurality of switching elements includes a first set of switching elements, and wherein the capacitance network includes a plurality of branches connected in parallel, each branch including a capacitor of the first set of capacitors and a switching element of the first set of switching elements connected in series, such that a selected capacitance of the plurality of branches includes a sum of the capacitances of the capacitors in the branches having their switching elements closed.

17. The method of claim 16, wherein the circuit is configured to operate each of the first set of switching elements based on a respective bit of the one or more bits, and wherein a capacitance of each of the first set of capacitors is selected based on a significance of the respective bit.

18. The method of claim 16, wherein the plurality of switching elements includes a second set of switching elements, and wherein the plurality of branches are connected together at points between the capacitor and the switching element of each branch by way of one of the second set of switching elements.

19. The method of claim 18, wherein the circuit is configured to operate the capacitance network such that, by configuring the first set of switching elements, the first selected capacitance includes the selected capacitance of the plurality of branches, and such that, by connecting all of the plurality of branches together by closing all of the second set of switching elements, the second selected capacitance includes a total capacitance of all of the first set of capacitors.

20. The method of claim 16, wherein the plurality of capacitors includes a multiplication capacitor, and wherein the circuit is configured to operate the capacitance network such that the first selected capacitance corresponds to a capacitance of the multiplication capacitor, and such that, by configuring the first set of switching elements, the second selected capacitance includes a sum of the capacitance of the multiplication capacitor plus the selected capacitance of the plurality of branches.

* * * * *